(12) United States Patent
Kawamoto

(10) Patent No.: US 6,495,866 B2
(45) Date of Patent: Dec. 17, 2002

(54) SEMICONDUCTOR DEVICE FOR PREVENTING AN INCREASED CLAMP VOLTAGE IN AN IGNITION CIRCUIT

(75) Inventor: Atsunobu Kawamoto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/828,949

(22) Filed: Apr. 10, 2001

(65) Prior Publication Data

US 2002/0050603 A1 May 2, 2002

(30) Foreign Application Priority Data

Oct. 31, 2000 (JP) .......................... 2000-332463

(51) Int. Cl.$^7$ ............................................. H01L 29/74
(52) U.S. Cl. .................. 257/175; 257/488; 451/36; 327/110
(58) Field of Search ................ 257/488; 451/36; 450/41; 327/110

(56) References Cited

U.S. PATENT DOCUMENTS

| | | | |
|---|---|---|---|
| 4,695,867 A | * | 9/1987 | Flohrs et al. ............... 257/488 |
| 6,100,728 A | * | 8/2000 | Shreve et al. ............... 327/110 |
| 6,270,393 B1 | * | 8/2001 | Kubota et al. ............... 450/41 |

FOREIGN PATENT DOCUMENTS

JP 6-275634 9/1994

* cited by examiner

*Primary Examiner*—Hoai Ho
*Assistant Examiner*—Mai-Huong Tran
(74) *Attorney, Agent, or Firm*—Oblon, Spivak, McClelland, Maier & Neustadt, P.C.

(57) ABSTRACT

Providing a semiconductor device for use in a ignition circuit, which prevents an increase in clamp voltage and allows application of a constant voltage across an ignition plug. In a semiconductor device which comprises a transistor and a zener diode connected between a collector and a gate of the transistor, a glass coat layer coating the zener diode is made of silicon oxide.

20 Claims, 3 Drawing Sheets

SEMICONDUCTOR DEVICE FOR PREVENTING AN INCREASED CLAMP VOLTAGE IN AN IGNITION CIRCUIT

FIELD OF THE INVENTION

The present invention relates to a semiconductor device for controlling an ignition coil for an automobile or the like, and more particularly, to a semiconductor device comprising a transistor and a zener diode.

DISCUSSION OF THE BACKGROUND

FIG. 4 shows an ignition circuit of an internal combustion engine of an automobile or the like. The ignition circuit comprises a semiconductor device 21 for controlling an ignition coil. An induction coil 22 and a power source 23 are connected to a cathode terminal (C) of the semiconductor device 21. A resistor 25 is connected to a gate terminal (G) of the semiconductor device 21. The gate terminal (G) receives a control signal 26 of the semiconductor device 21. An emitter terminal (E) of the semiconductor device 21 is grounded.

The semiconductor device 21 comprises an insulated gate bipolar transistor (hereinafter referred to as "IGBT") 27. A zener diode 28 and a diode 29 are connected in series between a gate and a cathode of the IGBT 27.

In the ignition circuit, as the control signal 26 changes the IGBT 27 from the ON-state to the OFF-state, a predetermined voltage is developed on the primary side of the induction coil 22. Due to the zener diode 28, the voltage is always a constant voltage (hereinafter referred to as "clamp voltage"). As a result, a constant induced voltage is generated also on the secondary side of the induction coil 22, and this induced voltage is applied across an ignition plug 24. This sets sparks flying between the terminals, igniting an internal combustion engine or the like. In order to realize stable ignition, it is necessary to always apply a constant voltage across the ignition plug 24.

FIG. 5 is a cross sectional view of a conventional semiconductor device generally denoted at 150 for use in an ignition circuit. In the semiconductor device 150, a p-type well 2 is formed in an n-type silicon semiconductor substrate 1, and an n-type source region 3 is formed in the well 2. A gate electrode layer 9 is formed on the well 2 through an insulation layer 8. Meanwhile, an emitter electrode 10 electrically connected with the well 2 is formed on the well 2.

Further, a field oxide film 6 is formed on the semiconductor substrate 1, and a zener diode 7 of polycrystalline silicon is formed on the field oxide film 6. The zener diode 7 has a plurality of pn junction surfaces, and each pn junction surface is approximately perpendicular to a surface of the semiconductor substrate 1.

In FIG. 5, a diode (denoted at 29 in FIG. 4) is formed in series with the zener diode 7. In addition, the insulation layer 8 is formed on the zener diode 7, and a gate electrode 11 and a collector electrode 12 are electrically connected with the zener diode 7 through a hole formed in the insulation layer 8. The gate electrode 11 and the gate electrode layer 9 are electrically connected with each other.

Further, a p-type guard ring layer 4 is formed on the semiconductor substrate 1 below the zener diode 7.

A glass coat layer 33 of silicon nitride is formed as a protection film on a top surface of the semiconductor substrate 1.

On the other hand, an n-type buffer layer 14 and a p-type collector layer 15 are stacked one atop the other in this order on a back surface of the semiconductor substrate 1.

At last, a collector electrode 16 is formed on the p-type collector layer 15.

However, in an ignition circuit in which the semiconductor device 150 shown in FIG. 5 is used in the semiconductor device 21 shown in FIG. 4, if the semiconductor device 150 is switched (on/off) over a few million cycles, for example, the clamp voltage increases, and therefore, the voltage applied across the ignition plug 24 changes largely.

SUMMARY OF THE INVENTION

The present invention aims at providing a semiconductor device for preventing an increased clamp voltage and applying a constant voltage across an ignition plug in an ignition circuit.

As a result of intensive research, the inventor of the present invention discovered that while a semiconductor device is heated in the presence of hydrogen while forming a glass coat layer of the semiconductor device, hydrogen enters into the glass coat layer, and in turn the hydrogen diffuses in a zener diode during switching and a zener voltage accordingly changes.

In short, the present invention is directed to a semiconductor device comprising a transistor whose collector is connected to an induction coil and a zener diode connected between said collector and a gate of said transistor, wherein a constant induced voltage is generated in said induction coil in accordance with a signal supplied to said gate, said semiconductor device comprising: a semiconductor substrate; a transistor formed on said semiconductor substrate; a zener diode formed on said semiconductor substrate such that a pn junction surface is approximately perpendicular to a surface of said semiconductor substrate; and a glass coat layer formed on said semiconductor substrate so as to coat said zener diode, wherein said glass coat layer is an silicon oxide film.

Since the glass coat layer is made of silicon oxide, it is not necessary, unlike customarily practiced, to execute a step of forming the glass coat layer in a hydrogen-reduced atmosphere. This prevents diffusion of hydrogen in the zener diode during switching, and hence, to reduce a change in clamp voltage within the semiconductor device.

In addition, the present invention is directed to a semiconductor device comprising a transistor whose collector is connected to an induction coil and a zener diode connected between said collector and a gate of said transistor, wherein a constant induced voltage is generated in said induction coil in accordance with a signal supplied to said gate, said semiconductor device comprising: a semiconductor substrate; a transistor formed on said semiconductor substrate; a zener diode formed on said semiconductor substrate such that a pn junction surface is approximately perpendicular to a surface of said semiconductor substrate; and a glass coat layer of silicon nitride formed on said semiconductor substrate, wherein said glass coat layer is formed except for an area above said pn junction surface of said zener diode.

With this structure as well, it is possible to prevent diffusion of hydrogen in the zener diode and reduce a change in clamp voltage within the semiconductor device.

The glass coat layer of silicon nitride may be formed except for at least in an area above the pn junction surface of the zener diode, so that a change in clamp voltage within the semiconductor device is effectively suppressed.

The zener diode may include a plurality of pn junction surfaces.

It is preferable that an n-type region of said zener diode is connected to said gate of said transistor and a p-type region of said zener diode is connected to said collector of said transistor.

The zener diode is formed preferably on a field oxide film formed on said semiconductor substrate, and an insulation film is formed preferably between said zener diode and said glass coat layer.

The zener diode may be made of polycrystalline silicon.

Further, in the semiconductor device, a diode of a forward direction opposite to said zener diode may be disposed in series with said zener diode between said collector and said gate of said transistor.

The transistor is preferably an insulated gate bipolar transistor.

As described clearly above, application of the semiconductor device according to the present invention to an ignition circuit makes it possible to repeat stable ignition.

DETAILED DESCRIPTION OF THE PREFERRED EMBODIMENTS

First Embodiment

Figure 1:
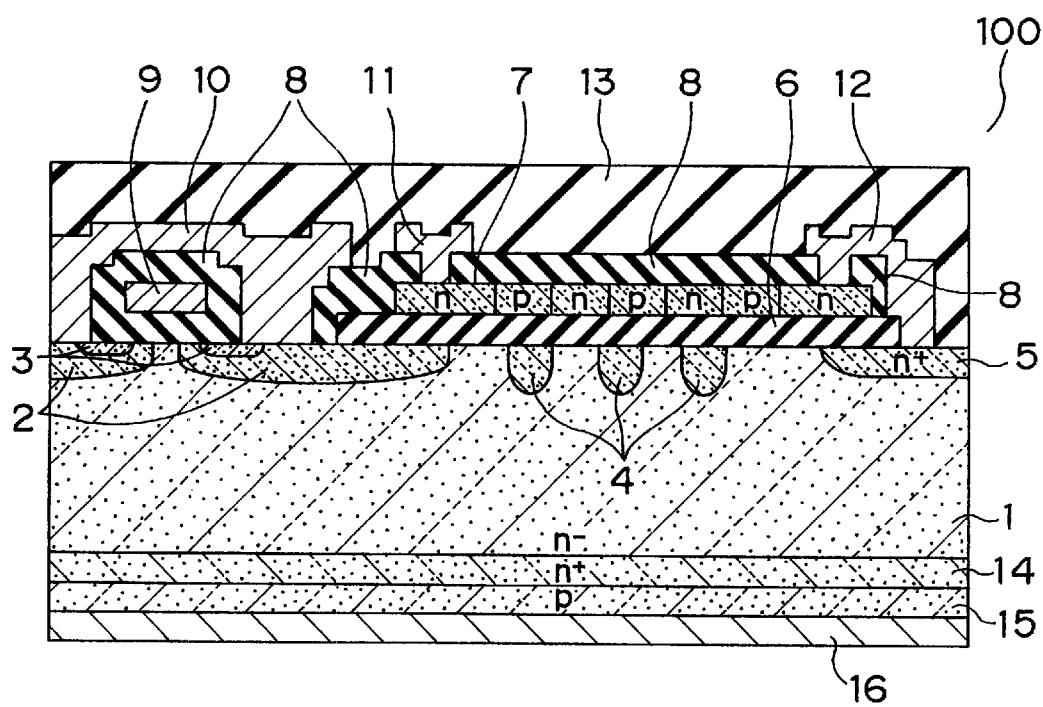
FIG. 1 is a cross sectional view of the semiconductor device according to the first embodiment.
Figure 5:
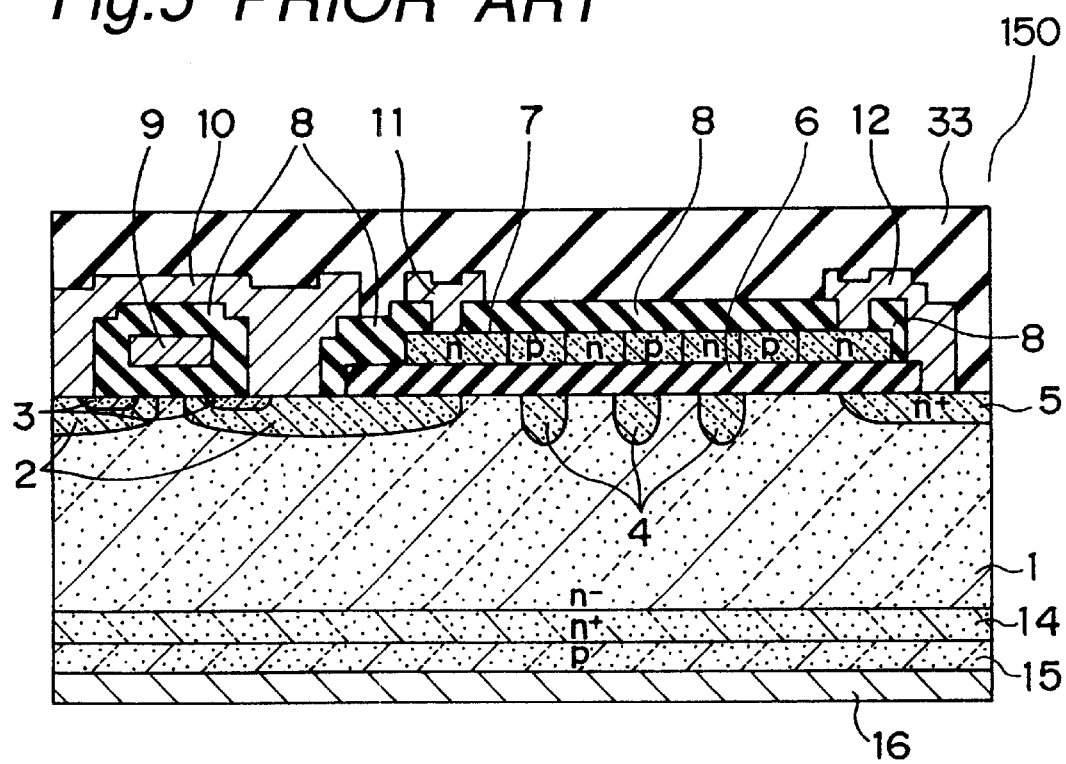
FIG. 5 is a cross sectional view of a conventional semiconductor device.

FIG. 1 is a cross sectional view of a semiconductor device according to a first embodiment. The semiconductor device shown in FIG. 1 is the same as the semiconductor device shown in FIG. 5 as it is modified such that a glass coat layer 33 of silicon nitride is replaced with the glass coat layer 13 of silicon oxide. Other structures are the same as FIG. 5.

In the semiconductor device shown in FIG. 1, after forming a zener diode 7, electrodes 10, 11 and 12 or the like on a semiconductor substrate 1, the glass coat layer 13 of silicon oxide is deposited over a resultant surface.

Thermal CVD is used, for example, for deposition of the glass coat layer 13 of silicon oxide. With the thermal CVD method, the semiconductor substrate 1 seating the zener diode 7 and the like is loaded in a heating furnace and heated up, and further, $SiH_4$ and $O_2$ are introduced into the heating furnace. As a result, the glass coat layer 13 of silicon oxide is formed on the semiconductor substrate 1.

In this manner, using silicon oxide as a material of the glass coat layer 13, it is not necessary to execute the step of forming the glass coat layer 13 in a hydrogen-reduced atmosphere.

That is, as the glass coat layer 13 of silicon oxide formable in the presence of oxygen is formed, instead of a layer of silicon nitride which needs forming in a hydrogen-reduced atmosphere such as the conventional glass coat layer 33, hydrogen does not enter into the glass coat layer 13 during deposition of the glass coat layer 13, which in turn prevents diffusion of hydrogen in the zener diode 7 through the insulation film 8 during switching.

Figure 2:
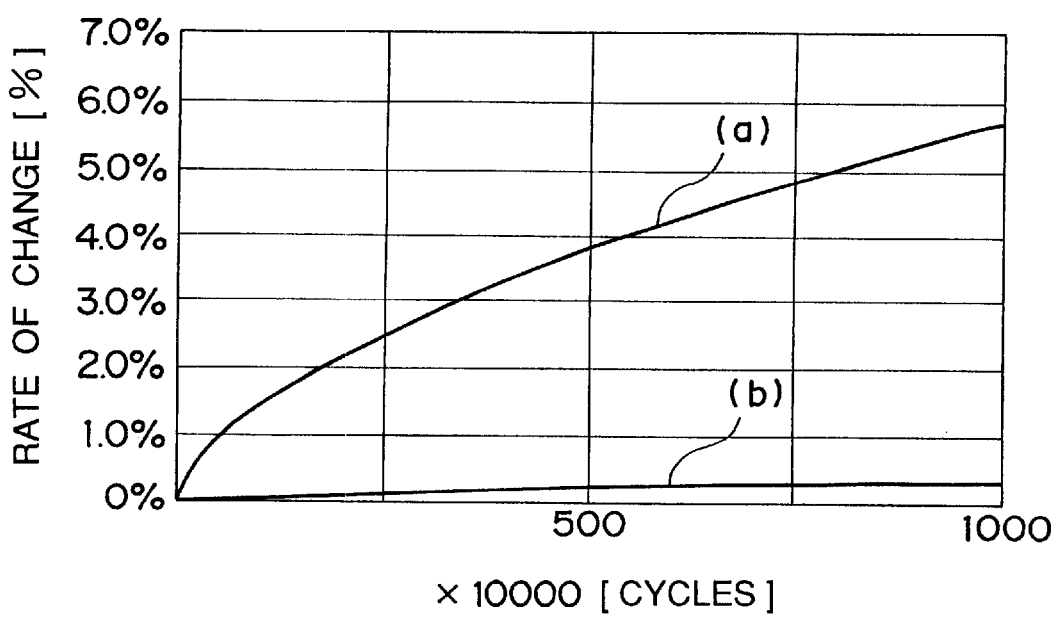
FIG. 2 shows a relationship between ignition cycles of an ignition plug and a rate of change in primary voltage of an induction coil.

FIG. 2 shows relationships between ignition cycles and a rate of change in clamp voltage in an ignition circuit using the semiconductor device 100 according to the first embodiment and in an ignition circuit using the conventional semiconductor device 150. The horizontal axis in FIG. 2 denotes the ignition cycles each defined as turning on and off of the semiconductor device. The vertical axis in FIG. 2 denotes a rate at which a clamp voltage generated on the primary side of the induction coil 22 changes.

In FIG. 2, the result expressed as (a) corresponds to the ignition circuit using the conventional semiconductor device 150, while the result expressed as (b) corresponds to the ignition circuit using the semiconductor device 100 according to the first embodiment.

As clearly shown in FIG. 2, upon ignition after 10 million cycles, the clamp voltage changes approximately 5.7% in the conventional semiconductor device 150, whereas the change is suppressed to approximately 0.4% in the case of the semiconductor device 101 according to the first embodiment.

Thus, when silicon oxide is used as the material of the glass coat layer 13, it is possible to prevent diffusion of hydrogen in the zener diode 7, and therefore, to obviate a change in the zener voltage of zener diode 7.

As a result, a change of the clamp voltage applied to the primary side of the induction coil of the ignition circuit is reduced to about 1/15.

Second Embodiment

Figure 3:
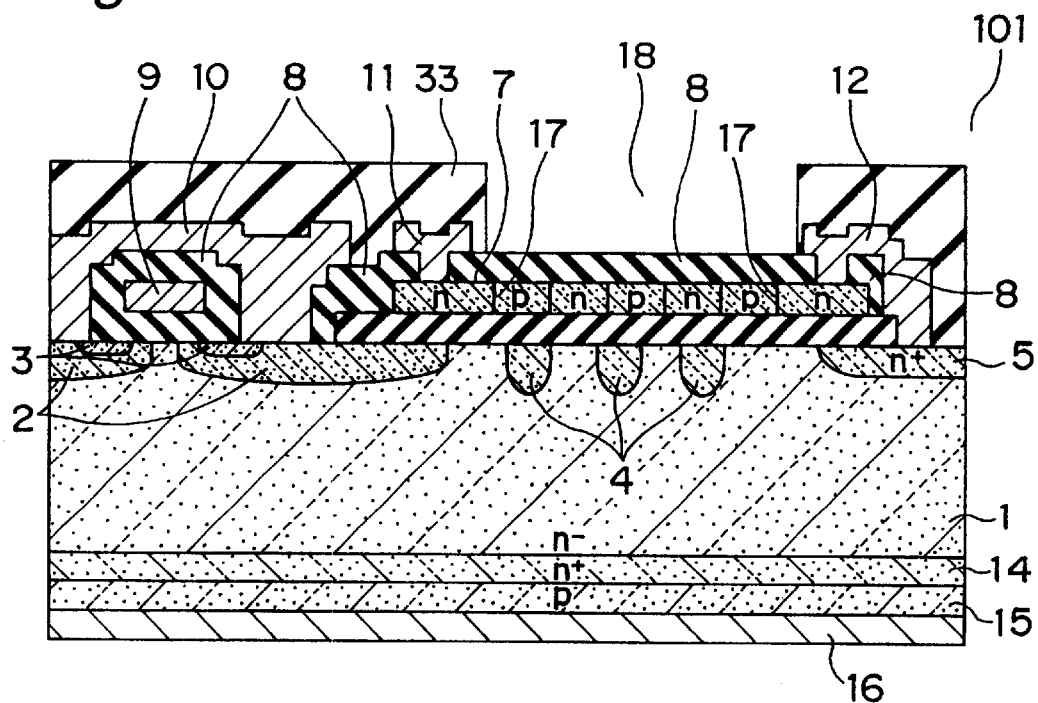
FIG. 3 is a cross sectional view of the semiconductor device according to the second embodiment.
Figure 4:
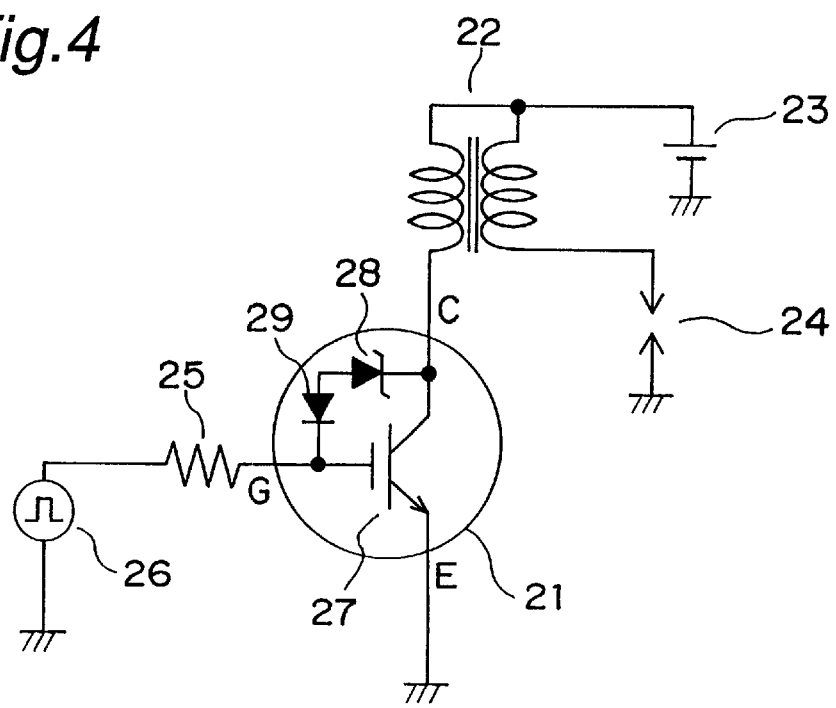
FIG. 4 is a circuitry diagram of an ignition circuit of an internal combustion engine.

FIG. 3 is a cross sectional view of a semiconductor device according to a second embodiment. In the semiconductor device shown in FIG. 3, although the glass coat layer 33 is made of silicon nitride, the glass coat layer 33 is formed exclusively except for in an area above a pn junction surface of the zener diode.

In the semiconductor device 101 shown in FIG. 3, after the zener diode 7, the insulation layer 8, the electrodes 10, 11 and 12 and the like are formed on the semiconductor substrate 1 as in the first embodiment, the glass coat layer 33 of silicon nitride is formed over the entire surface by thermal CVD, for example, as in the conventional methods.

While silicon nitride is created in a hydrogen-reduced atmosphere, in the second embodiment, since the glass coat layer 33 is removed by etching above the pn junction surface 17 of the zener diode 7, it is possible to prevent diffusion of hydrogen in the zener diode 7 during switching.

Since a top portion of the zener diode 7 is coated with the insulation layer 8, a problem such as a deteriorated moisture resistance does not occur even if an opening portion 18 is formed.

What is claimed is:

1. A semiconductor device comprising a transistor whose collector is connected to an induction coil and a zener diode connected between said collector and a gate of said transistor, wherein a constant induced voltage is generated in said induction coil in accordance with a signal supplied to said gate, said semiconductor device comprising:

a semiconductor substrate;

a transistor formed on said semiconductor substrate;

a zener diode formed on said semiconductor substrate such that a pn junction surface is approximately perpendicular to a surface of said semiconductor substrate; and a glass coat layer formed on said semiconductor substrate so as to coat said zener diode, wherein said glass coat layer is a silicon oxide film.

2. The semiconductor device according to claim 1, wherein said zener diode includes a plurality of pn junction surfaces.

3. The semiconductor device according to claim 1, wherein an n-type region of said zener diode is connected to said gate of said transistor and a p-type region of said zener diode is connected to said collector of said transistor.

4. The semiconductor device according to claim 1, wherein said zener diode is formed on a field oxide film formed on said semiconductor substrate, and an insulation film is formed between said zener diode and said glass coat layer.

5. The semiconductor device according to claim 1, wherein said zener diode is made of polycrystalline silicon.

6. The semiconductor device according to claim 1, wherein a diode of a forward direction opposite to said zener diode is disposed in series with said zener diode between said collector and said gate of said transistor.

7. The semiconductor device according to claim 1, wherein said transistor is an insulated gate bipolar transistor.

8. A semiconductor device comprising a transistor whose collector is connected to an induction coil and a zener diode connected between said collector and a gate of said transistor, where a constant induced voltage is generated in said induction coil in accordance with a signal supplied to said gate, said semiconductor device comprising:
- a semiconductor substrate;
- a transistor formed on said semiconductor substrate;
- a zener diode formed on said semiconductor substrate such that a pn junction surface is approximately perpendicular to a surface of said semiconductor substrate; and
- a glass coat layer of silicon nitride formed on said semiconductor substrate, wherein said glass coat layer is formed except for in an area above said pn junction surface of said zener diode.

9. The semiconductor device according to claim 8, wherein said zener diode includes a plurality of pn junction surfaces.

10. The semiconductor device according to claim 8, wherein an n-type region of said zener diode is connected to said gate of said transistor and a p-type region of said zener diode is connected to said collector of said transistor.

11. The semiconductor device according to claim 8, wherein said zener diode is formed on a field oxide film formed on said semiconductor substrate, and an insulation film is formed between said zener diode and said glass coat layer.

12. The semiconductor device according to claim 8, wherein said zener diode is made of polycrystalline silicon.

13. The semiconductor device according to claim 8, wherein a diode of a forward direction opposite to said zener diode is disposed in series with said zener diode between said collector and said gate of said transistor.

14. The semiconductor device according to claim 8, wherein said transistor is an insulated gate bipolar transistor.

15. A semiconductor device comprising a transistor whose collector is connected to an induction coil and a zener diode connected between said collector and a gate of said transistor, wherein a constant induced voltage is generated in said induction coil in accordance with a signal supplied to said gate, said semiconductor device comprising:
- a semiconductor substrate;
- a transistor formed on said semiconductor substrate;
- a zener diode formed on said semiconductor substrate such that a pn junction surface is approximately perpendicular to a surface of said semiconductor substrate; and
- a silicon oxide film formed on said semiconductor substrate so as to coat said zener diode.

16. The semiconductor device according to claim 15, wherein said zener diode includes a plurality of pn junction surfaces.

17. The semiconductor device according to claim 15, wherein an n-type region of said zener diode is connected to said gate of said transistor and a p-type region of said zener diode is connected to said collector of said transistor.

18. The semiconductor device according to claim 15, wherein said zener diode is formed on a field oxide film formed on said semiconductor substrate, and an insulation film is formed between said zener diode and said glass coat layer.

19. The semiconductor device according to claim 15, wherein said zener diode is made of polycrystalline silicon.

20. The semiconductor device according to claim 15, wherein a diode of a forward direction opposite to said zener diode is disposed in series with said zener diode between said collector and said gate of said transistor.

* * * * *